United States Patent [19]

Ohtaka et al.

[11] Patent Number: 5,108,843
[45] Date of Patent: Apr. 28, 1992

[54] THIN FILM SEMICONDUCTOR AND PROCESS FOR PRODUCING THE SAME

[75] Inventors: Kouichi Ohtaka, Shibata; Hiroshi Muira, Natori; Masafumi Kumano, Sendai, all of Japan

[73] Assignees: Ricoh Company, Ltd., Tokyo; Ricoh Research Institute of General Electronics Co., Ltd., Natori, both of Japan

[21] Appl. No.: 441,949

[22] Filed: Nov. 27, 1989

[30] Foreign Application Priority Data

Nov. 30, 1988 [JP] Japan ............................. 63-304765
Nov. 30, 1988 [JP] Japan ............................. 63-304766

[51] Int. Cl.$^5$ ............................................. B32B 9/04
[52] U.S. Cl. ...................................... 428/446; 428/212; 428/428; 428/698; 428/699; 428/701; 428/704
[58] Field of Search ............ 428/428, 446, 698, 699, 428/212, 701, 704

[56] References Cited

U.S. PATENT DOCUMENTS

| | | | |
|---|---|---|---|
| 4,019,169 | 5/1978 | Bohg et al. | 428/428 |
| 4,180,618 | 12/1979 | Alpha et al. | 428/446 |
| 4,643,950 | 2/1987 | Ogura et al. | 428/699 |
| 4,732,801 | 3/1988 | Joshi | 428/698 |
| 4,795,679 | 1/1989 | Ramesh et al. | 428/446 |
| 4,847,157 | 7/1989 | Goodman et al. | 428/428 |

OTHER PUBLICATIONS

Tsaur, B-Y, et al., Stress-enhanced carrier mobility in zone melting recrystallized polycrystalline Si-films on $SiO_2$-coated substrates, Appl. Phys. Lett., No. 40(4), 1982, pp. 322-324.

Lyon, S. A., et al., Microstrain in laser-crystallized Silicon islands on fused silica, Appl. Phys. Lett. No. 40(4), 1982, pp. 316-318.

Hawkins, W. G., et al., Growth of single-crystal silicon islands on bulk fused silica by $CO_2$ laser annealing, Appl. Phys. Lett., No. 40(4), 1982, pp. 319-321.

*Primary Examiner*—Ellis P. Robinson
*Assistant Examiner*—Archene Turner
*Attorney, Agent, or Firm*—Cooper & Dunham

[57] ABSTRACT

A thin film semiconductor which comprises a substrate, a single crystalline silicone thin film layer and an intermediate layer disposed between the substrate and the single-crystalline silicon thin film layer. Coefficient of the thermal expansion of the intermediate layer is between those of the substrate and the single-crystalline silicon. The intermediate layer absorbs thermal stress and relaxes strain remaining in the silicon layer, which strain is generated due to difference of thermal expansion coefficient between the substrate and the silicon layer. Due to the arrangement of the intermediate layer, it becomes possible to use various material as the substrate without generating micro-cracks and produce a semiconductor device using a large sized substrate.

4 Claims, 6 Drawing Sheets

N₂O OR H₂ / N₂ / SiH₄

THIN FILM SEMICONDUCTOR AND PROCESS FOR PRODUCING THE SAME

BACKGROUND OF THE INVENTION

The present invention relates to a thin film semiconductor comprising a dielectic substrate and a single crystal silicon thin film thereon and a process for producing the same.

Such a thin film semiconductor is utilized for constituting various OA (office automation) equipments such as a large sized image scanning and driving device and a displaying and driving device.

Conventionally, it is known to produce a thin film by a plasma CVD (chemical vapor deposition) method, a thermal CVD method, an optical CVD method, an LP-CVD method, an MO-CVD method, a sputtering method or a vacuum evaporation method. In accordance with either method, the produced thin film has a crystal structure which is resembled to that of the substrate. Therefore, when the substrate is made from glass or ceramics, which is most generally used as an electric insulation material, a single crystal thin film can not be formed on the substrate by the above-mentioned method but instead a polycrystalline or amorphous thin film is formed on the substrate.

In order to obtain a single crystal thin film using the glass or ceramic substrate, it has been proposed a ZMR (Zone Melting Recrystallization) method in which the polycrystalline or amorphous silicon thin film is converted to a single crystal thin film by melting and re-crystallizing the polycrystalline or amorphous silicon thin film. In accordance with this ZMR method, an advantage is that an invariable crystal direction is predominantly arranged on the crystallized film surface due to the anisotropy of the surface energy of the silicon thin film at the time of melting and recrystallization thereof.

Examples of heating means for melting the silicon film in accordance with the ZMR method are (1) a radio frequency carbon susceptor heating method, (2) an infrared heating method and (3) strip heater method. In accordance with either method, the polycrystalline or amorphous thin film formed on the sutbstrate have to be heated to a temperature more than the melting point of the thin film. Therefore, when a silicon thin film is to be treated, the heating temperature must be more than 1412° C. which is the melting point of silicon.

Such a high temperature process required for recrystallization of the thin film causes thermal unbalance during the process of single crystal growth, which results in that crystal defects are generated in the single crystal thin film and/or that the substrate is deformed by the heat.

For example, micro-cracks are generated on surface of the substrate of crystal glass as one of the crystal defects mentioned above. When a silicon film having such micro-cracks formed therein is used for constituting a transistor device or other electronic devices, characteristic of responsiveness is impaired and reliable function can not be achieved.

The micro-cracks are supposed to be generated by the reason as follows.

The supporting member (substrate) which is made from quartz glass has a coefficient of thermal expansion of about $5 \times 10^{-7}$/°C. Whereas silicon has a coefficient of thermal expansion of about $40 \times 10^{-7}$/°C. Therefore, the amount of expansion and contraction of silicon is larger than that of the quartz substrate in the process of heating to the high temperature and cooling down to the room temperature. However, the thickness of the silicon film is very thin (0.5 $\mu$m to 1 $\mu$m) when compared with that of the quartz glass substrate (0.5 mm to 1 mm). Therefore, the expansion and contraction of the silicon film in the direction in parallel with the film and substrate surface is restricted by the quartz glass substrate so that strain is generated and remains within the silicon film, which causes to form micro-cracks in the silicon film.

In order to obviate the above-mentioned problems, it is proposed to divide the silicon film to a plurality of separated islands in a size of $25 \times 25$ $\mu$m to $100 \times 100$ $\mu$m so as to the crack generation.

However, when the island of the silicon film is formed in a large size, it becomes difficult to avoid generation of cracks in the island. Therefore, the area of the silicon film is limited to being small so that a silicon film of large size can not be obtained, thus preventing realization of electronic elements of high pattern density since the area for forming the thin film is limited.

The above-mentioned problem is not limited to the case in which the substrate is made from quartz glass but inevitable when the coefficient of thermal expansion of the substrate material is different from that of silicon.

As mentioned before, in accordance with the ZMR method, the silicon thin film is heated and melted by (1) a radio frequency carbon susceptor heating method, (2) an infrared heating method or (3) a strip heater method. Also, in accordance with the ZMR method, it is necessary to slowly cool the molten silicon when solidifying it to obtain a high quality recrystallized thin film. In either of the above-mentioned methods (1) to (3), the substrate is also heated almost to the melting point 1412° C. of silicon so as to slow down the cooling speed of the silicon film.

Therefore, the substrate have to be made from a material which is stable at this temperature. If the substrate is furthermore required to be transparent, the material for constituting the substrate is limited to quartz which has a softening point of 1650° C.

It has been proposed to use a thin film transistor comprising the silicon thin film formed on a predetermined substrate, according as the recent development of electronic devices of large size such as a one-dimensional photo-sensor which is elongated in size for reading or scanning images, a scanning device of an image scanner comprising a two-dimensional photo-sensor having a large scanning area, and a driver device of an image display using a liquid crystal material, an electrochromic material or an electroluminescense material. The silicon thin film of such a transistor is usually made from amorphous silicon or polycrystalline silicon since these silicon materials are relatively easy to form on a a large sized substrate.

It is required to realize the above-mentioned device which functions in a high speed and reliably. Accordingly, it is needed to upgrade the functional guality of the thin film transistor that constitutes a driving circuit of the device. However, the mobility of the amorphous silicon thin film transistor is about 0. 1 to 1.0 cm$^2$/v.s. Also, the mobility of the polycrystalline silicon thin film transistor is about 1.0 to 10 cm$^2$/v.s. Such mobility of the amorphous silicon transistor or the polycrystalline silicon transistor is far from that of the single-crystalline silicon transistor which mobility is more than 600 cm²/v.s.

Accordingly, it is needed to develop a technique to form a single-crystalline silicon thin film on a substrate of large size.

SUMMARY OF THE INVENTION

It is therefore an object of the present invention to obviate the above-mentioned problems and provide a thin film semiconductor comprising a single-crystalline silicon thin film which semiconductor can be formed on a large sized substrate without generating crystal defects such as micro cracks.

Also, it is another object of the present invention to provide a semiconductor stacking structure which enables to use various kind of material as the substrate without being limited to quartz in the process of the above-mentioned ZMR method used for forming a single-crystalline silicon for a thin film electronic device.

Also, it is still another object of the present invention to provide a novel technique enabling to use an electric insulation material for constituting the substrate which material has a melting point below that of silicon.

Further, it is still another object of the present invention to provide a novel method for producing the novel semiconductor stacking structure.

The object of the invention can be achieved by a thin film semiconductor comprising a substrate, a single-crystalline silicon layer and an intermediate layer disposed between the substrate and the silicon layer and having a thermal expansion coefficient which is between those of the substrate and the silicon layer.

The intermediate layer relaxes strain which is generated in the silicon layer during the high temperature process by the ZMR method and prevents impurities from diffusing from the substrate to the silicon layer.

The object of the invention can also be achieved by a thin film semiconductor comprising a substrate having one of softening point and melting point lower than melting point of silicon (1412° C.), a thermal damping buffer layer having one of softening point and melting point higher than melting point of silicon and a single-crystalline silicon thin film layer.

Also, the above-mentioned object of the invention can be achieved by a method of producing a thin film semiconductor comprising a step (a) for producing a thermal damping buffer layer of a thin film made from a material having one of melting point and softening point higher than melting point of silicon on a substrate made from a material having one of melting point and softening point lower than melting point of silicon, a step (b) for forming a silicon layer made from one of a polycrystalline silicon thin film and an amorphous silicon thin film on the thermal damping buffer layer, a step (c) for forming a surface protection layer made from a material having one of melting point and softening point higher than melting point of silicon on the silicon layer, a step (d) for irradiating a laser beam to a stack composed of the substrate, the thermal buffer layer, the silicon layer and the surface protection layer from a side of the surface protection layer so as to convert the silicon layer material to a single-crystalline silicon thin film by melting and recrystallizing the silicon layer which is made from one of a polycrystalline silicon thin film and an amorphous silicon thin film and a step (e) for removing the surface protection layer from the stack.

The substrate is made from a material which can be formed in a large size and has a melting point lower than 1412° C. Examples of such a material are glass such as borosilicate glass, lead glass and alumino-silicate glass and ceramics. It is desirable to choose a material which has a coefficient of thermal expansion which is close to that of single-crystalline silicon. Also, it is desirable to choose a transparent material when the semiconductor is to be used as a photosensor.

The thickness of the substrate is usually about 0.3 mm to 5 mm desirably about 0.5 mm to 1.5 mm.

The thermal buffer layer is made from a material which has a melting point or a softening point higher than 1412° C. Desirable examples of the thermal buffer layer material as an electric insulation material are $SiO_2$, $Al_2O_3$, $TiO_2$, $ZrO_2$, $Si_3N_4$, BN and combination of these materials. Also, desirable examples of the thermal buffer material as an electric conductive material are carbon compounds such as TiC and SiC. Usually, the thermal buffer material is made from an electric insulation material or combination of electric conductive material and an insulation material coated thereon.

It is desirable to choose a material of the thermal buffer layer which material has a coefficient of thermal expansion which is close to that of single-crystalline silicon. Also, it is desirable to choose a material which has a high affinity for the silicon layer. From this stand point, it is desirable to use a material which includes an element such as Si or O.

The recrystallized single-crystalline silicon layer is initially composed of a polycrystalline layer or an amorphous layer. This initial layer can be formed on the thermal buffer layer by either of a plasma CVD process, a thermal CVD process, a photo-CVD process, an LP-CVD process, MOCVD process, a sputtering process and a vacuum evaporating process. The thickness of this initial layer is about 0.1 μm to 5 μm, desirably about 0.1 μm to 1.5 μm.

In order to obtain the recrystallized single-crystalline silicon layer, it is necessary that the initial layer of polycrystalline or amorphous silicon is completely molten. The molten layer must be held between the thermal buffer layer and the surface protection layer.

The surface protection layer is made from an insulation material. The surface protection layer may be of a single layer structure composed of $SiO_2$ or $Si_3N_4$ or double layer structure composed of $SiO_2$ and $Si_3N_4$. The protection layer is formed on the polycrystalline or amorphous layer by the plasma CVD process, the thermal CVD process, the photo CVD process, the LP-CVD process, the MOCVD process, the sputtering process or the vacuum evaporation process. The thickness of the surface protection layer is about 0.5 μm to 5 μm, desirably about 1.0 μm to 2.0 μm. This surface protection layer is usually removed by etching after the single-crystalline silicon is recrystallized.

The polycrystalline or amorphous silicon film is converted to a single-crystalline silicon film by the ZMR method using a laser beam as a heating means. It is necessary to use a laser beam as the heating means when the above-mentioned materials are used in the recrystallization process.

Advantages of the above-mentioned thin film semiconductor structure of the present invention are that a large sized thin film can be obtained without generating micro cracks which impair the thin film quality and that impurities are prevented from diffusing from the substrate to the silicon layer, which upgrades the functional characteristic of the thin film semiconductor.

Also, another advantage of the present invention is that various materials become to be usable as the dielectric substrate. This advantage is not simply that materials other than quartz can be used as the substrate. This advantage due to widening the selectable range of the substrate material is further described below.

The thickness of the whole thin film semiconductor is almost occupied by the substrate thickness so that the semiconductor is largely affected by expansion and contraction of the substrate due to that generated from the semiconductor. Coefficient of thermal expansion of the single-crystalline silicon is about $5\times10^{-7}/°C$. whereas that of quartz is about $40\times10^{-7}/°C$. Because of such a large difference of the thermal expansion coefficient between the two materials, strain remains within the single-crystalline silicon thin film so that micro cracks are generated to relax the strain in the thin film and/or that the layers of the two materials are separated. However, in accordance with the present invention, it is possible to use various materials as the substrate other than quartz so that it becomes possible to choose a material having a thermal expansion coefficient which is close to that of the silicon layer so as to avoid the generation of micro cracks in the recrystallized silicon thin film.

Also, in accordance with the present invention, it becomes possible to form a single-crystalline silicon thin film on a large sized substrate by using a material such as glass which can be formed in a large size.

Also, it becomes possible to obtain a plurality of single-crystalline silicon areas of different crystal direction on the same substrate by controlling the condition of recrystallization. Therefore, it becomes possible to form, for example, an image reading element and a display element or TFT on the common substrate, which makes it possible to realize a high quality and small sized sensor and display device or an image scanner or display device having a TFT driving circuit.

As mentioned above, the thin film semiconductor in accordance with the present invention makes it possible to realize a large sized image scanning and driving device of on OA equipment or a displaying and driving device from one substrate, which is very useful and satisfies needs in the information processing computer field.

Also, in accordance with the present invention, a laser beam is used as a heating means so that it becomes possible to selectively irradiate part of the stack of layers which part is to be melted and recrystallized.

Also, another advantage of the present invention is that the substrate can be made from a material having a melting point lower than that of silicon (1412° C.) by arranging a thermal buffer layer between the substrate and the silicon thin film layer so as to prevent thermal impact or heat transfer from affecting to the silicon thin film from the substrate. The thermal buffer layer is made from a material having a melting point higher than that of silicon (1412° C.).

Further objects and advantages of the present invention will be apparent from the following description of the preferred embodiments of the invention as illustrated in the accompanying drawings.

BRIEF DESCRIPTION OF THE DRAWINGS

FIG. 13b is a sectional view of the stack of layers including the polycrystalline silicon film layer of FIG. 13a.

DESCRIPTION OF THE PREFERRED EMBODIMENTS

Figure 1:
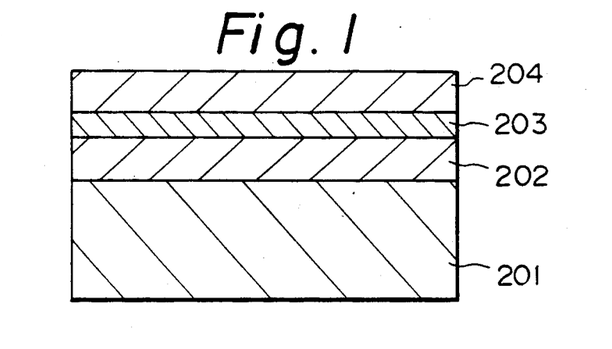
FIG. 1 is a constructional view of an essential structure of a thin film semiconductor in accordance with the present invention.

An essential structure of the thin film semiconductor in accordance with the present invention is described hereinafter with reference to FIG. 1.

A substrate 201 is made from a dielectric material such as quartz glass or ceramics. The thickness of the substrate 201 is about 0.3 mm to 5 mm, desirably 0.5 mm to 1.5 mm.

An intermediate layer 202 comprises a single layer made from an electric insulation material composition of which changes in a direction of thickness thereof. Or otherwise, the intermediate layer 202 may comprise a plurality of layers of different material wherein at least a layer which is in contact with the silicon layer 203 is made from an insulation material. Examples of the insulation material for the intermediate layer are $SiO_2$, $Si_3N_4$, $SiON$, $ZrO_2$; $TiO_2$. And examples of the conductive material for the intermediate layer are SiC and TiC. It is to be noted that when the electric conductive material is used, an electric insulation layer must be disposed between the conductive layer and the silicon layer. These layers can be formed by either of a plasma CVD process, a thermal CVD process, an optical CVD process, an LP-CVD process, an MO-CVD process, a sputtering process, an ECR process, a vacuum evaporation process and an ion implantation process. It is desirable to form the intermediate layer to be thick as possible from the stand point of relaxing the stress remaining in the film. Practically, the thickness of the intermediate layer is about 2 $\mu$m or more, desirably 5 $\mu$m to 10 $\mu$m.

Figure 5:
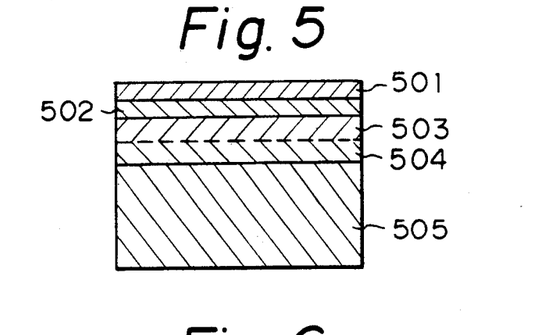
FIG. 5 is a constructional view of a second embodiment of the present invention.
Figure 6:
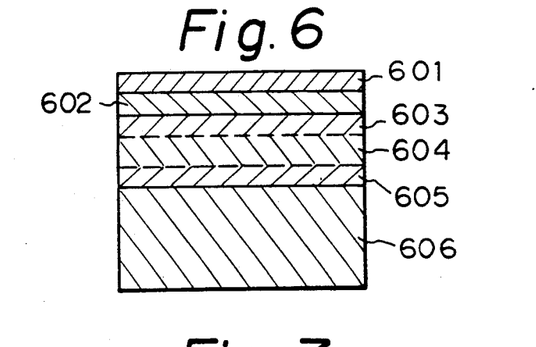
FIG. 6 is a constructional view of a third embodiment of the present invention.
Figure 8A:
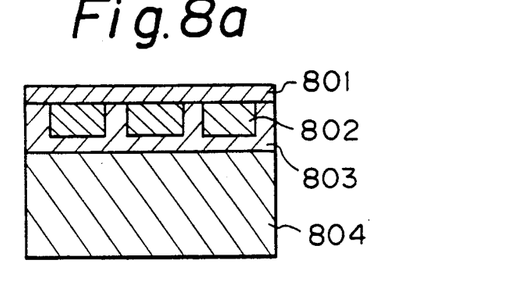
FIGS. 8a to 8c are explanatory views for explaining a process for forming an intermediate layer of the fourth embodiment of FIG. 7 and each representing a different step of the process in sequence.
Figure 8B:
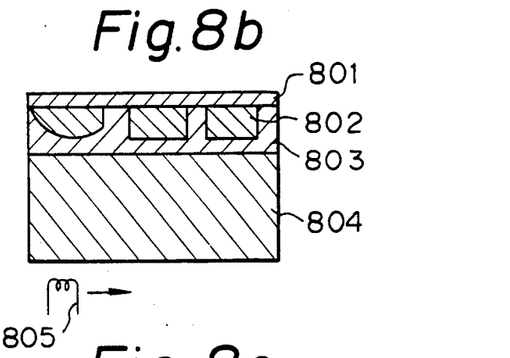
Figure 8C:
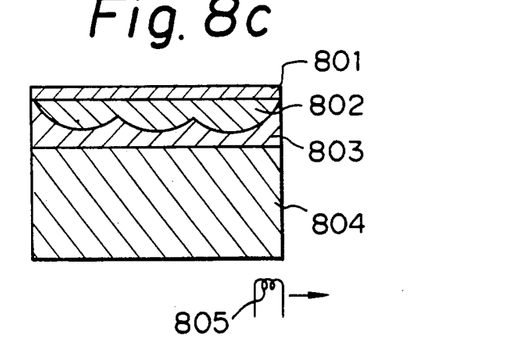

The intermediate layer may comprise a plurality of simply stacked plain layers as the second and third embodiments illustrated in FIGS. 5 and 6, respectively, described later. Or otherwise, the intermediate layer may comprise wave shaped layers as illustrated in FIG. 8c which layers are formed by such a way that first a continuous layer 803 and a discontinuous layer 802 are formed on a substrate 804, as illustrated in FIG. 8a, then a heating means 805 is moved from the left to the right as illustrated in FIG. 8b, so that the discontinuous layer 802 and an upper part of the continuous layer 803 are molten and after that solidified to form the intermediate layer as illustrated in FIG. 8c.

A desirable intermediate layer is arranged in such a way that near the boundary surface of the dielectric substrate, coefficient of thermal expansion of the intermediate layer is the same as or close to that of the substrate material, whereas near the boundary surface of the silicon thin film, coefficient of thermal expansion of the intermediate layer is the same as or close to that of the silicon film and that in the portion between the two boundary portions, coefficient of thermal expansion of the intermediate layer changes continuously from that of the substrate material to that of silicon.

Also, in order to avoid separation of the layers when strain is generated in the layers, the intermediate layer is desirably made from a material which has affinities for both of the substrate and the single-crystalline silicon such as a material which includes at least one of oxygen and nitrogen as an element of the compound.

A polycrystalline or amorphous silicon layer 203 is formed on the intermediate layer 202 by either of the plasma CVD process, the optical CVD process, the MO-CVD process, the LP-CVD process, the sputtering process and the ECR process. The thickness of this polycrystalline or amorphous layer is about 0.1 $\mu$m to 5 $\mu$m, desirably 0.1 $\mu$m to 1.5 $\mu$m.

A surface protection layer (capping layer) 204 is made from an any dielectric material known per se. Desirably, the surface protection layer is made from $SiO_2$, $Si_3N_4$ or combination of $SiO_2$ and $Si_3N_4$ to constitute a double layer structure. The surface protection layer is formed on the polycrystalline or amorphous silicon layer by either of the plasma CVD process, the thermal CVD process, the optical CVD process, the MO-CVD process, the LP-CVD process, the sputtering process, the ECR process and the vacuum evaporation process. The thickness of the surface protection layer is usually about 0.5 $\mu$m to 5 $\mu$m, desirably 1.0 $\mu$m to 2.0 $\mu$m.

After the stack of layers of the above mentioned structure is formed, the polycrystalline or amorphous silicon layer is melted and recrystallized by the ZMR process to convert the layer to a single-crystalline silicon film. A heat source of the heating means of the ZMR process such as the stripe heating means, the radio frequency heating means or the lamp heating means etc. is moved along the film surface so as to melt and recrystallize the polycrystalline or amorphous silicon film to form a single-crystalline silicon film layer.

Figure 2:
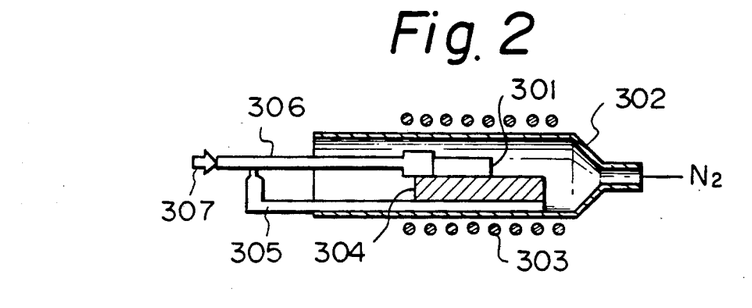
FIG. 2 is a constructional view of an aapparatus which is used in a ZMR process to form a recrystallized silicon.

FIG. 2 illustrates a radio frequency heating system used in the ZMR process mentioned above.

Figure 3:
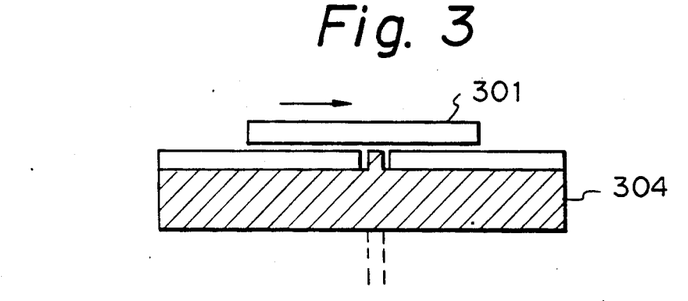
FIG. 3 is an explanatory view of the substrate disposed within the apparatus of FIG. 2.
Figure 3A:
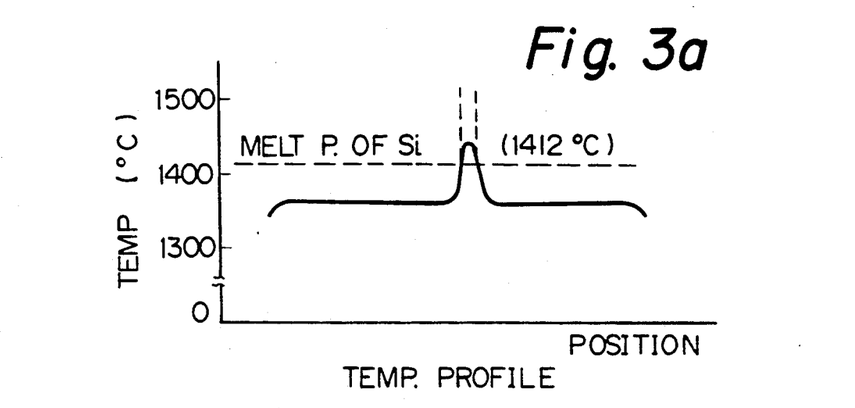
FIG. 3a is a chart for explaning a temperature distribution in a direction of scanning the substrate in FIG. 3.

FIG. 3 represents a temperature distribution on the stack of layers in the ZMR process mentioned above.

In FIG. 2, the above-mentioned stack of layers 301 is movably placed on a carbon susceptor 304 housed in a vessel 302 which is surrounded by a high frequency coil 303. Numerals 305, 306 and 307 designate a drawer, a reaction gas supply pipe and a reaction gas, respectively.

Figure 9:
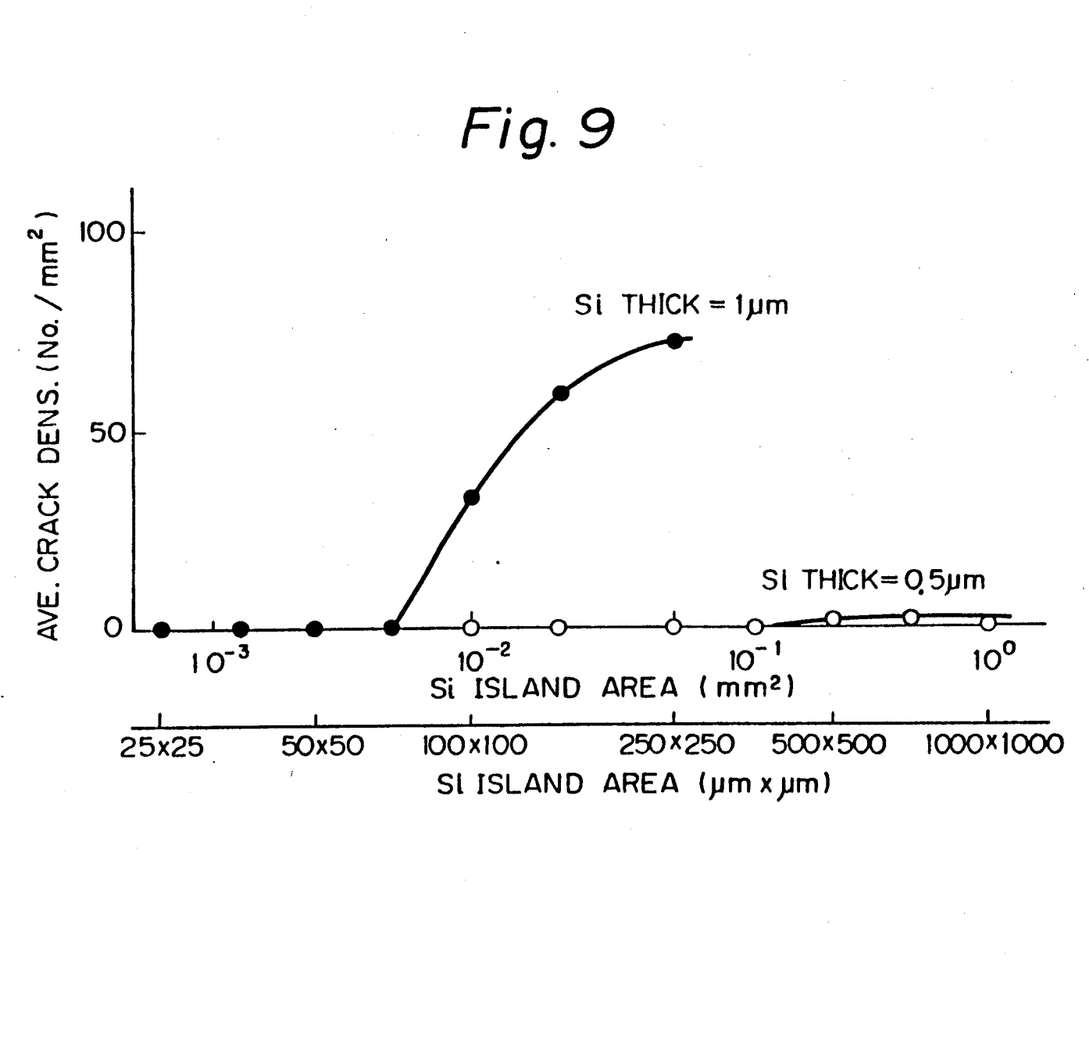
FIG. 9 is a graphical view of a relation between generation of micro cracks and island area of silicon layer in accordance with a prior art.
Figure 9A:
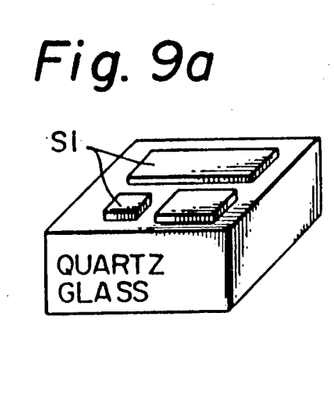
FIG. 9a is a constructional view of a silicon layer having island areas.

FIG. 9 represents micro crack generation ratio in relation to the island area in accordance with the prior art in which the silicon thin film is arranged in a plurality of islands as mentioned before. The ordinate represents average number of cracks generated in a square of 1 mm$^2$. The abscissa represents area of the island of the silicon film. As can be seen from the graph, the crack density increases according as the island area is enlarged. The above-mentioned structure of the present invention obviates the problem of cracks generated in the large sized silicon film.

Embodiments of the present invention are described hereinafter more specifically.

EMBODIMENT-1

Figure 4:
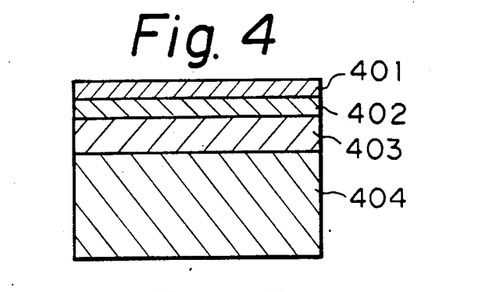
FIG. 4 is a constructional view of a first embodiment of the present invention.

A first embodiment of the present invention is described below with reference to FIG. 4.

A substrate 404 is made from quartz of 0.5 mm thick. An intermediate layer 403 is stacked on the quartz substrate 404. This intermediate layer 403 is made from $SiO_x N_y$ which is arranged so that the composition thereof is close to that of $SiO_2$ near the boundary of the quartz surface whereas it is close to that of $Si_3N_4$ near the boundary of the silicon film surface. Such a thin film of $SiO_x N_y$ is formed by the plasma CVD process changing the reaction gas and the gas flow rate during the time film growth. The thickness of the film of $SiO_x N_y$ is about 5 $\mu$m.

After that, a polycrystalline silicon layer 402 is formed on the intermediate layer 403 by the LP-CVD process. The thickness of the polycrystalline silicon layer is about 0.5 $\mu$m.

After that, a surface protection layer (capping layer) 401 of $SiO_2$ is stacked on the polycrystalline layer 402 by the thermal CVD process. The thickness of the capping layer 401 is about 1.5 $\mu$m.

The practical condition of the process for stacking each layer is represented in Table-1 below.

TABLE 1

| LAYER | MATRL | (Stacking Condition) | |
|---|---|---|---|
| | | METHD | GAS & FLOW RATE |
| Intmdt 1 yr 403 | SiOxNy | Plasma CVD | $SiH_4/N_2O = 1/50$ ($NH_3 = 0$)~ $SiH_4/NH_3 = 1/15$ ($N_2O = 0$) |
| Silcon 1 yr 402 | Poly-cry Si | LP-CVD | $SiH_4/N_2 = 1/10$ |
| Cappng 1 yr 401 | $SiO_2$ | Plasma CVD | $SiH_4/N_2O = 1/50$ |

The stack of layers formed by the above-mentioned process is heated by the ZMR system using the radio frequency heating means illustrated in FIG. 2 to convert the polycrystalline silicon film to a single-crystalline silicon film.

FIG. 3 illustrates a temperature profile of the stack of layers 301 placed on the carbon susceptor 304 on the condition that the high frequency electric power is 9.7 kw. The substrate is moved at a scanning speed of 0.1 mm/sec maintaining the above-mentioned temperature profile of FIG. 3 so that the polycrystalline silicon layer is converted to a single-crystalline silicon film.

In accordance with the way mentioned above, the first embodiment of the thin film semiconductor of the present invention can be obtained.

The intermediate layer 403 composed of the SiOxNy film has a thermal expansion coefficient $\beta\text{buf} \approx 4 \times 10^{-7}$ (1/°C.) near the boundary of the quartz glass surface, which coefficient is almost equal to that of $SiO_2$. The composition of the intermediate layer 403 changes so that the SiOxNy film has a thermal expansion coefficient $\beta\text{buf} \approx 25 \times 10^{-7}$ (1/°C.) near the boundary of the silicon layer surface, which coefficient is almost equal to that of $Si_3N_4$.

More specifically, the composition of the intermediate layer 403 is arranged so that near the boundary of the quartz glass surface, the thermal expansion coefficient $\beta\text{buf} \approx \beta\text{sub}$, wherein $\beta\text{sub}$ is the thermal expansion coefficient of quartz glass substrate and nearly equal to $5.6 \times 10^{-7}$ (1/°C.), whereas near the boundary of the silicon film surface, the thermal expansion coefficient $\beta\text{buf} \approx \beta\text{si}$, wherein $\beta\text{si}$ is the thermal expansion coefficient of silicon and nearly equal to $26 \times 10^{-7}$ (1/°C.).

EXAMPLE-2

A second embodiment of the thin film semiconductor in accordance with the present invention is described hereinafter with reference to FIG. 5.

A substrate 505 is made from quartz of 0.5 mm thick. A first intermediate layer 504 which is made from $SiO_2$ of 2.5 μm thick is formed on the substrate 505 by a plasma CVD process. After that, a second intermediate layer 503 which is made from $Si_3N_4$ of 1.5 μm thick is formed on the first intermediate layer 504 also by the plasma CVD process.

After that, a polycrystalline silicon layer 502 of 0.45μm thick is formed on the intermediate layers 504, 503 by the plasma CVD process.

Finally, a capping layer 501 is formed on the polycrystalline silicon layer 502 in such a way that first a film of $SiO_2$ of 1.0μm thick is coated by the plasma CVD process and second a film of $Si_3N_4$ of 0.5 μm thick is coated thereon by the sputtering process.

The condition of stacking the layers of the second embodiment is represented in the Table-2 below.

TABLE 2

| LAYER | MATRL | METHD | GAS & FLOW RATE |
|---|---|---|---|
| Intmdt 1 yr 503 504 | SiOxNy | Plasma CVD | $SiH_4/N_2$ = 1/50 $SiH_4/CO_2$ = 1/15 |
| | $Si_3N_4$ | Plasma CVD | $SiH_4/NH_3$ = 1/25 |
| Silcon 1 yr 502 | Poly-cry Si | Plasma CVD | $SiH_4/H_2$ = 1/10 |
| Cappng 1 yr 501 | $SiO_2$ | Plasma CVD | $SiH_4/N_2O$ = 1/20 |
| | $Si_3N_4$ | Sputter | |

The stack of layers formed on the substrate as mentioned above is set in the ZMR system of FIG. 2 equipped with a radio frequency heating means. The substrate is moved on the carbon susceptor 301 which is the heat source at a scanning speed of 0.75 mm/sec whereby the polycrystalline silicon film 502 is converted to a single-crystalline film.

By the process mentioned above, the second embodiment of the present invention is produced.

With regard to the coefficient of thermal expansion of the intermediate layer of the above-mentioned structure, the first intermediate layer 504 of $SiO_2$ disposed on the quartz substrate side has a thermal expansion coefficient $\beta\text{buf} = 3 \times 10^{-7}$ (1/°C.) and the second intermediate layer 503 of $Si_3N_4$ disposed on the silicon layer side has a thermal expansion coefficient $\beta\text{buf} = 29 \times 10^{-7}$ (1/°C.).

EXAMPLE-3

A third embodiment of the thin film semiconductor in accordance with the present invention is described hereinafter with reference to FIG. 6.

A substrate 606 is made from quartz of 1.0 mm thick. A first intermediate layer 605 which is made from $SiO_2$ of 2.0 μm thick is formed on the substrate 606 by a plasma CVD process. After that, a second intermediate layer 604 which is made from SiON of 2.5 μm thick is formed on the first intermediate layer 605 also by the plasma CVD process. And after that, a third intermediate layer 603 which is made from $Si_3N_4$ of 2.0 μm thick is formed on the second intermediate layer 604 also by the plasma CVD process.

After that, a polycrystalline silicon layer 602 of 0.5 μm thick is formed on the intermediate layer 603 by the LP-CVD process.

Finally, a capping layer (surface protection layer) 601 of $SiO_2$ is formed on the polycrystalline silicon layer 602 by the plasma CVD process. The thickness of the capping layer of $SiO_2$ is about 1.5 μm.

The condition of stacking the layers of the third embodiment is represented in the Table-3 below.

TABLE 3

| LAYER | MATRL | METHD | GAS & FLOW RATE |
|---|---|---|---|
| Intmdt 1 yr 605 604 | $SiO_2$ | Plasma CVD | $SiH_4/N_2$ = 1/25 $SiH_4/CO_2$ = 1/50 |
| 603 | SiON | Plasma CVD | $SiH_4/N_2$ = 1/20 $SiH_4/CO_2$ = 1/25 |
| | $Si_3N_4$ | Plasma CVD | $SiH_4/NH_3$ = 1/15 |
| Silcon 1 yr 602 | Poly-cry Si | LP-CVD | $SiH_4/N_2$ = 1/10 |
| Cappng 1 yr 601 | $SiO_2$ | Plasma CVD | $SiH_4/N_2$ = 1/50 $SiH_4/CO_2$ = 1/15 |

The stack of layers formed on the substrate as mentioned above is set in the ZMR system of FIG. 2 equipped with a radio frequency heating means. The substrate is moved on the carbon susceptor 301 which is the heat source at a scanning speed of 0.5 mm/sec whereby the polycrystalline silicon film 602 is converted to a single-crystalline film.

By the process mentioned above, the third embodiment of the present invention is produced.

The coefficient of thermal expansion of the intermediate layer is arranged to change from the quartz substrate side to the silicon layer side in such a way that the first, second and third intermediate layers 605, 604 and 603 have a thermal expansion coefficient $\beta\text{buf}$ of $3 \times 10^{-6}$ (1/°C.), $15 \times 10^{-7}$ (1/°C.) and $29 \times 10^{-7}$ (1/°C.), respectively.

EXAMPLE -4

Figure 7:
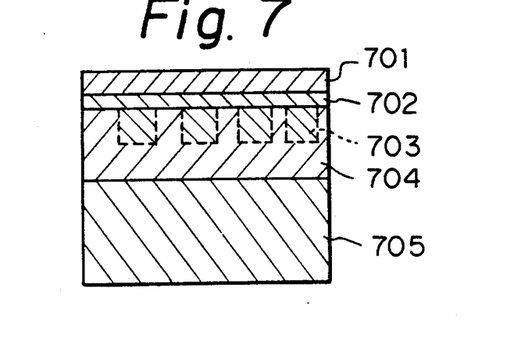
FIG. 7 is a constructional view of a fourth embodiment of the present invention.

A fourth embodiment of the thin film semiconductor in accordance with the present invention is described hereinafter with reference to FIG. 7.

A substrate 705 is made from quartz of 0.5 mm thick. An intermediate layer 704 of $SiO_2$ is formed on the substrate 705 by the plasma CVD process. The thickness of the intermediate layer 704 is about 3.5 μm. Then, the intermediate layer 704 of $SiO_2$ is covered by a mask having an opening pattern of stripes. Nitrogen atoms are implanted into the $SiO_2$ intermediate layer 704 through the stripe openings of the mask by an ion plantation method as represented by dash lines 703. After that, the mask is removed and a polycrystalline silicon film 702 of 0.5 μm thick is formed on the intermediate layer 704 by an ECR method.

Finally, a capping layer (surface protection layer) 701 of 1.0 μm thick is formed on the polycrystalline silicon layer 702. The capping layer 701 comprises a film of $SiO_2$ formed by an ECR method.

The condition of stacking the layers of the above-mentioned embodiment of the present invention is represented in Table-4 below.

TABLE 4

| | (Stacking Condition) | | |
|---|---|---|---|
| LAYER | MATRL | METHD | GAS & FLOW RATE |
| Intmdt 1 yr 704 | $SiO_2$ | Plasma CVD | $SiH_4/N_2O = 1/55$ |
| Silcon 1 yr 702 | Poly-cry Si | ECR | $SiH_4/H_2 = 1/20$ |
| Cappng 1 yr 701 | $SiO_2$ | ECR | $SiH_4/H_2 = 1/20$ $SiH_4/CO_2 = 1/50$ |

The stack of layers formed on the substrate as mentioned above is set in the ZMR system equipped with a radio frequency heating means illustrated in FIG. 2. The substrate is moved on the carbon susceptor 301 which is the heat source of ZMR system at a scanning speed of 0.5 mm/sec in a direction perpendicular to the stripes in which nitrogen atoms are implanted, thereby the polycrystalline silicon is converted to a single-crystalline silicon.

By the process mentioned above, the fourth embodiment of the present invention is produced.

With regard to the thermal expansion coefficient of the intermediate layer 704 mentioned above, the composition of the layer is so arranged that the portion of the layer composed of $SiO_2$ has a thermal expansion coefficient $\beta buf \approx 4 \times 10^{-7}(1/°C.)$ whereas the portion where nitrogen atoms are implanted has a thermal expansion coefficient $\beta buf \approx 25 \times 10^{-7}(1/°C.)$.

During the high temperature process of the ZMR method, the nitrogen atoms implanted in the intermediate layer is diffused within the intermediate layer so that the composition of the layer changes in such a way that the thermal expansion coefficient $\beta buf$ near the boundary of the silicon layer surface is nearly equal to the thermal expansion coefficient $\beta si$ of silicon, whereas $\beta buf$ near the boundary of the quartz substrate surface is nearly equal to the thermal expansion coefficient $\beta sub$ of quartz.

EXAMPLE OF PRIOR ART

In order to compare with the structure of the present invention, a prior art structure of the thin film semiconductor is formed on the quarts substrate which is the same as that of the first embodiment of the present invention under the condition represented in Table-5 below. The prior art structure comprises no intermediate layers.

TABLE 5

| | (Stacking Condition) | | | |
|---|---|---|---|---|
| LAYER | MATRL | METHD | GAS & FLOW RATE | THCK |
| Silcon layer | Poly-cry Si | LP-CVD | $SiH_4/N_2 = 1/10$ | 0.45 μm |
| Cappng layer | $SiO_2$ | Plasma CVD | $SiH_4/N_2O = 1/50$ | 1.5 μm |

The thin film semiconductors in accordance with the first to fourth embodiments of the present invention mentioned above are compared with the thin film semiconductor in accordance with the prior art below.

The embodiments of the present invention and the prior art structure are evaluated by comparing the number of micro-cracks generated in a unit area (average micro crack density). The result of the evaluation is represented in Table-6 below.

TABLE 6

| | (Average Micro-crack Density) |
|---|---|
| SAMPLE | AVRGE MCRCRCK DNSTY (per $mm^2$) |
| Prior Art | 50 |
| Example-1 | 5 |
| Example-2 | 20 |
| Example-3 | 15 |
| Example-4 | 5 |

As can be seen from the Table-6 described above, the thin film semiconductor in accordance with the present invention has less number of micro-cracks generated in the silicon film than the prior art structure. This effect of the invention is obtained from the featured structure of the intermediate layer disposed between the silicon layer and the quartz glass substrate so that the strain which is remaining in the silicon film is relaxed.

Figure 10:
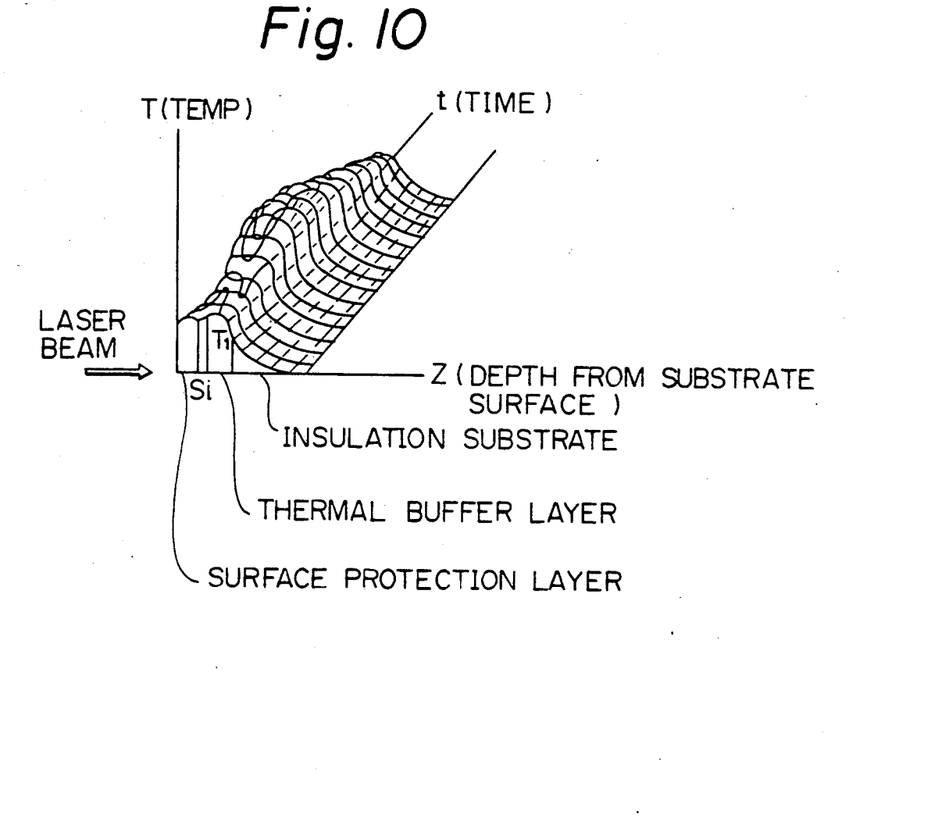
FIG. 10 is an explanatory view of temperature change of a stack of layers in accordance with the present invention.

FIG. 10 is a three-dimensional graph representing a temperature distribution in the stack of layers of semiconductor in the process of ZMR method uning a laser beam. The laser beam comprises, for example, an argon laser having a wavelength of 5145 Å which is absorbed only by the silicon layer. By irradiating such an argon laser beam to the stack of layers, the silicon layer is heated so that the temperature thereof rises to the melting point thereof. Thereby the silicon layer is melted and recrystallized as mentioned before.

In this melting and recrystallizing process, temperature $T_1$ of the substrate disposed under the silicon layer can be maintained relatively low by arranging a thermal buffer layer between the silicon layer and the substrate. The thermal buffer layer comprises a material which has an adequate optical absorption coefficient with respect to the wavelength of the laser beam and an adequate heat transfer coefficient.

EXAMPLE-5

A fifth embodiment of the thin film semiconductor in accordance with the present invention is described hereinafter with reference to FIGS. 11 to 14.

A substrate 1201 (FIG. 11) comprises a borosilicate glass plate of 40.0 mm long, 40.0 mm wide and 1.0 mm thick, for example, Corning #7740 (trade name). The softening point of this borosilicate glass is 820° C. The substrate surface in the side on which the polycrystalline silicon thin film is formed is polished so that unevenness of the surface becomes below 500 Å.

Figure 11:
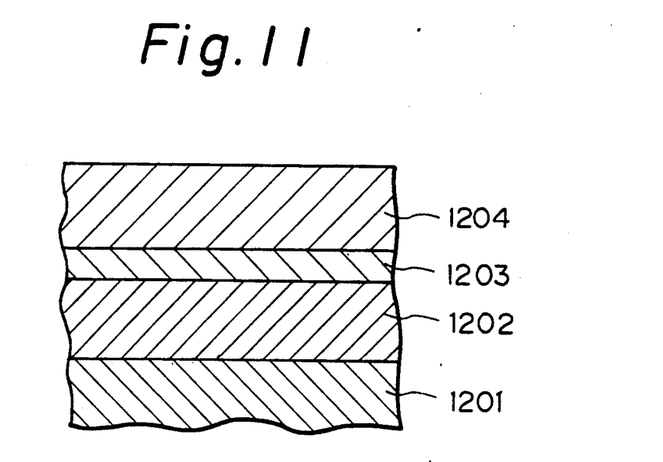
FIG. 11 is a constructional view of a thin film semiconductor in accordance with the present invention.

The glass substrate 1201 is cleaned by the following steps in sequence.

(1) First, the glass is treated by a boiling detergent composed of a mixing solution of sulfuric acid (98 weight %) and hydrogen peroxide (49 weight %) in a ratio of 1:1 for 10 minutes.

(2) Second, the glass is treated by a boiling detergent composed of a mixing solution of hydrochloric acid (36 weight %), hydrogen peroxide (49 weight %) and water in a ratio of 1:1:4 for 10 minutes.

(3) Third, the glass is treated by a boiling detergent composed of a mixing solution of aqueous ammonia (40 weight %), hydrogen peroxide (49 weight %) and water in a ratio of 1:1:4 for 10 minutes.

(4) Fourth, the glass is treated by a detergent composed of a mixing solution of hydrofluoric acid (20 weight %) and water in a ratio of 1:10 for 30 seconds.

After that, the glass is dried by blowing a drying nitrogen gas.

After that, a thermal buffer layer 1202 is formed on the cleaned surface of the substrate 1201 mentioned above. The thermal buffer layer 1202 is made from heat resistant $SiO_2$ thin film which is formed on the substrate by the low pressure chemical vapor deposition system (LP-CVD system) illustrated in FIG. 12.

Figure 12:
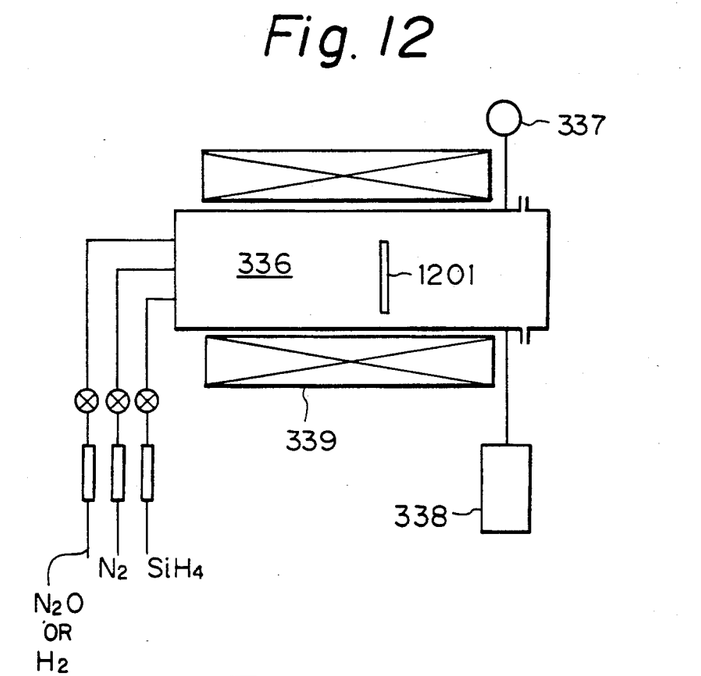
FIG. 12 is a constructional view of a low pressure chemical vapor deposition system for forming the $SiO_2$ layer and polycrystalline silicon layer in accordance with the fifth embodiment of the present invention.

In FIG. 12, numeral 336 designates a film deposition chamber, numeral 337 designates a pressure gauge, numeral 338 designates a vacuum pump and numeral 339 designates a coil.

The $SiO_2$ thin film 1202 is formed in accordance with the following sequence and condition.

(a) The borosilicate glass substrate 1201 is set within the thin film deposition chamber 336 which is then evacuated below a vacuum pressure of $2.5 \times 10^{-2}$ Torr.

(b) The film deposition chamber 336 is maintained at a temperature of $750° \pm 1°$ C. In this state, silane gas ($SiH_4$ without dilution) of 1 ml/sec flow rate and nitrous oxide gas ($N_2O$ without dilution) of 50 ml/sec flow rate are supplied into the chamber so that a thin film of $SiO_2$ is formed on the substrate 1201. The time for deposition of $SiO_2$ is 30 hours. During this time for the film deposition, the chamber is maintained at a pressure of $2.0 \pm 0.1$ Torr.

(c) After a predetermined time has passed for the deposition of $SiO_2$, the silane gas and the nitrous oxide gas are stopped. Then, nitrogen gas is introduced to the chamber at a flow rate of 50 ml/sec so that the substrate is gradually cooled down to a temperature below 25° C. at a cooling speed of about 7° C./min in the atmosphere of nitrogen gas.

(d) When the temperature in the chamber becomes below 25° C., the substrate 1201 is taken out of the chamber which is arranged to be in a state of atmospheric pressure in the atmosphere of nitrogen gas.

The thickness of the thin film 1202 of $SiO_2$ deposited on the substrate 1201 as a thermal buffer layer is within a range of $25 \pm 1$ μm.

After that, a polycrystalline silicon thin film 1203 is formed on the thermal buffer layer 1202 by the low pressure chemical vapor deposition system illustrated in FIG. 12 in accordance with the following sequence and condition.

(e) The borosilicate acid glass substrate 1201 on which the $SiO_2$ thin film 1202 is coated is set in the film deposition chamber. The chamber is evacuated to a vacuum pressure below $2.5 \times 10^{-2}$ Torr.

(f) The film deposition chamber 336 is maintained at a temperature of $650° \pm 1°$ C. In this state, silane gas ($SiH_4$ without dilution) of 5 ml/sec flow rate and nitrogen gas of 50 ml/sec flow rate are supplied into the chamber so that a thin film of polycrystalline silicon is formed on the substrate 1201. The time for the thin film deposition of is 6 minutes. During this time for the film deposition, the chamber is maintained at a pressure of $1.0 \pm 0.1$ Torr.

(g) After a predetermined time has passed for the deposition of polycrystalline silicon, the silane gas is stopped. Then, the substrate is gradually cooled down to a temperature below 25° C. at a cooling speed of about 7° C./min in the atmosphere of nitrogen gas.

(h) When the temperature in the chamber becomes below 25° C., the substrate 1201 is taken out of the chamber which is arranged to be in a state of atmospheric pressure in the atmosphere of nitrogen gas.

The thickness of the polycrystalline silicon thin film 1203 is within a range of $3000 \pm 200$ Å. According to a result of X-ray diffraction, the thin film surface is almost constituted by crystal face of (110) plane and the grain size is about 500 Å.

Figure 13A:
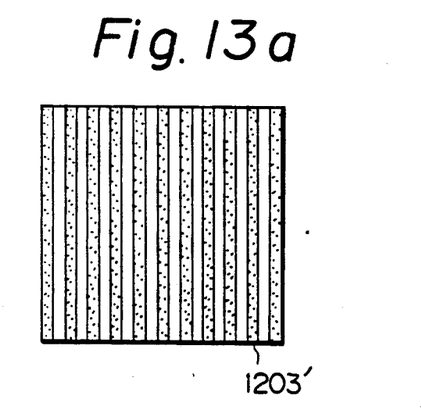
FIG. 13a is an upper view of a polycrystalline silicon film formed in a shape of stripes in accordance with the fifth embodiment of the present invention.

The polycrystalline silicon thin film 1203 is etched to have a shape of stripes of 100 μm wide by a photo-lithographic technique.

After that, an $SiO_2$ thin film 1204 is formed on the polycrystalline silicon film 1203. The $SiO_2$ thin film functions as a surface protection layer at the time of melting and recrystallizing of the polycrystalline silicon layer with the use of the low pressure chemical vapor deposition system illustrated in FIG. 12.

It is to be noted that the same apparatus is never commonly used for depositing the silicon thin film and the $SiO_2$ thin film so as to keep the purity of the thin film. Even if the structure of the apparatus for depositing each thin film is the same together, a different individual apparatus of the same structure is prepared and used for each thin film. However, in the above-mentioned explanation on the thin film depositing process, a same apparatus of FIG. 12 is repeatedly used for making different thin films for only the sake of simplifying the drawings and explanation.

The surface protection layer 1204 is formed in accordance with the following sequence and conditions.

(i) The borosilicate glass substrate 1201 on which the intermediate layer 1202 and the polycrystalline silicone layer 1203 is formed is set within the thin film deposition chamber 336 which is then evacuated below a vacuum pressure of $2.5 \times 10^{-2}$ Torr.

(j) The film deposition chamber 336 is maintained at a temperature of $750° \pm 1°$ C. In this state, silane gas ($SiH_4$ without dilution) of 1 ml/sec flow rate and nitrous oxide gas ($N_2O$ without dilution) of 50 ml/sec flow rate are supplied into the chamber so that a thin film of $SiO_2$ is formed on the substrate 1201. The time for disposition of $SiO_2$ is 3 hours. During this time for the film deposition, the chamber is maintained at a pressure of $2.0 \pm 0.1$ Torr.

(k) After a predetermined time has passed for the deposition of $SiO_2$, the silane gas and the nitrous oxide gas are stopped. Then, nitrogen gas is introduced to the chamber at a flow rate of 50 ml/sec so that the substrate is gradually cooled down to temperature below 25° C. at a cooling speed of about 7° C./min in the atmosphere of nitrogen gas.

(1) When the temperature in the chamber becomes below 25° C., the substrate 1201 is taken out of the chamber which is arranged to be in a state of atmospheric pressure in the atmosphere of nitrogen gas.

The thickness of the thin film 1204 of SiO$_2$ deposited on the substrate 1201 as a surface protection layer is within a range of 2.3 ±0.3 μm.

Figure 14:
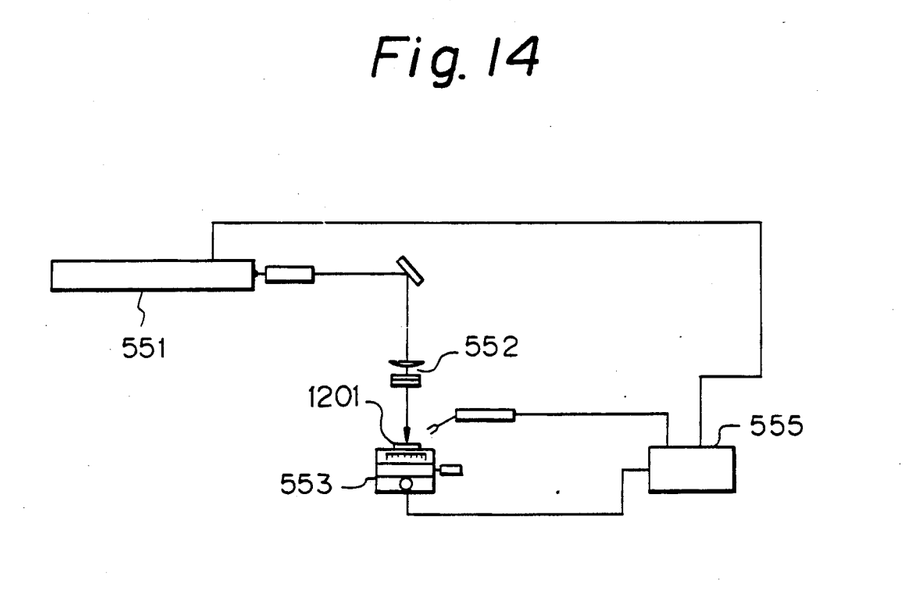
FIG. 14 is a constructional view of the laser ZMR system used to produce the fifth embodiment of the present invention.

The polycrystalline silicon thine film semiconductor produced in accordance with the above-mentioned process is melted and recrystallized by the laser ZMR system illustrated in FIG. 14 so as to obtain a single-crystalline silicon thin film semiconductor.

In FIG. 14. numeral 551 designates a laser source, numeral 552 designates a condensing optical system including a cylindrical lens. numeral 553 designates an X-Y table and numeral 555 designates a control means.

The laser beam for recrystallizing the silicon layer comprises an argon (Ar) laser in the above-mentioned process of the embodiment of the present invention. The laser beam is arranged to form an ellipse (600 μm×50 μm on the sample) by passing through two cylindrical lenses. The argon laser beam is irradiated to the sample (stack of layers for semiconductor) in such a way that the longitudinal axis of the ellipse is perpendicular to the stripes 1203′ of FIG. 13a of the polycrystalline silicon layer. The laser beam scans the sample along the direction of the polycrystalline silicon stripes 1203′.

Figure 13B:
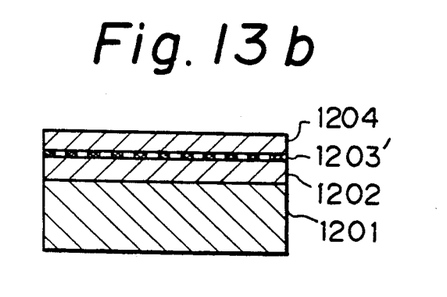

As illustrated in FIG. 31b, the polycrystalline silicon stripes layer 1203′ is arranged between the intermediate layer 1202 and the surface protection layer 1204.

It is necessary that the argon laser has an output power of 15 W to melt and recrystallize the polycrystalline silicon on the condition that the scanning speed thereof is 0.5 mm/sec.

The recrystallized silicon thin film comprises a single-crystalline silicon having no crystal grain field over the whole stripes .Also, the direction of the crystal face is the (100) plane direction.

In accordance with the above-mentioned process, the fifth embodiment of the thin film semiconductor of the present invention can be obtained.

It is to be noted that an amorphous silicon can be similarly recrystallized by ZMR method as the polycrystalline silicon of the above-mentioned embodiments.

Many widely different embodiments of the present invention may be constructed without departing from the spirit and scope of the present invention. It should be understood that the present invention is not limited to the specific embodiment described in the specification, except as defined in the appended claims.

What is claimed is:

1. A thin film semiconductor comprising:
a substrate made of quartz;
a single-crystalline silicon layer; and
an intermediate layer formed between said substrate and said single-crystalline silicon layer, said intermediate layer having a composition which varies according to depth such that a first boundary of said intermediate layer has a first thermal expansion coefficient approximately equal to the thermal expansion coefficient of said substrate, said first boundary contacting with said substrate, and that a second boundary of said intermediate layer has a second thermal expansion coefficient approximately equal to the thermal expansion coefficient of said single-crystalline silicon layer, said second boundary contacting with said single-crystalline silicon layer, said first boundary having a first composition which is close to a composition of SiO$_2$, said second boundary having a second composition which is close to a composition of Si$_3$N$_4$, an intermediate region between said first boundary and said second boundary varying continuously in composition thereof from a composition close to said first composition to another composition close to said second composition, and said intermediate layer having as a whole a composition represented by a formula of SiO$_x$N$_y$.

2. A thin film semiconductor comprising:
a substrate made of quartz;
a single-crystalline silicon layer; and
an intermediate layer formed between said substrate and said single-crystalline silicon layer, said intermediate layer having a composition which varies according to depth such that a first boundary of said intermediate layer has a first thermal expansion coefficient approximately equal to the thermal expansion coefficient of said substrate, said first boundary contacting with said substrate, and that a second boundary of said intermediate layer has a second thermal expansion coefficient approximately equal to the thermal expansion coefficient of said single-crystalline silicon layer, said second boundary contacting with said single-crystalline silicon layer, said intermediate layer including a first layer of SiO$_2$ formed on a surface of said substrate and having said first thermal expansion coefficient, a second layer of SiON formed on said first layer, and a third layer of Si$_3$N$_4$ formed on said second layer and having said second thermal expansion coefficient, said second layer of SiON having a thermal expansion coefficient intermediate between said first thermal expansion coefficient and said second thermal expansion coefficient.

3. A thin film seconductor comprising:
a substrate made of quartz;
a single-crystalline silicon layer; and
an intermediate layer is formed between said substrate and said single-crystalline silicon layer, and said intermediate layer having a composition which varies according to depth such that a first boundary of said intermediate layer has a first thermal expansion coefficient approximately equal to the thermal expansion coefficient of said substrate, said first boundary contacting with said substrate, and that a second boundary of said intermediate layer has a second thermal expansion coefficient approximately equal to the thermal expansion coefficient of said single-crystalline silicon layer, said second boundary contacting with said single-crystalline silicon layer, said intermediate layer including a first layer of SiO$_2$ formed on a surface of said substrate and having said first thermal expansion coefficient, and a second layer of SiON formed on said first layer and having said second thermal expansion coefficient.

4. A thin film semiconductor according to claim 3, in which said second layer of SiON is composed of a substance produced by implanting nitrogen atoms into said first layer of SiO$_2$ and thereafter thermally diffusing said implanted nitrogen atoms within said first layer of SiO$_2$.

* * * * *

UNITED STATES PATENT AND TRADEMARK OFFICE
CERTIFICATE OF CORRECTION

PATENT NO. : 5,108,843
DATED : April 28, 1992
INVENTOR(S) : Kouichi Ohtaka and Hiroshi Miura It is certified that error appears in the above-identified patent and that said Letters Patent is hereby corrected as shown below:

Title page, left-hand column, section [75], lines 2-3, delete "Masafumi Kumano, Sendai, all" and insert --both--.

"Hiroshi Muira" should read --Hiroshi Miura--.

Signed and Sealed this

Twenty-first Day of September, 1993

Attest:

BRUCE LEHMAN

*Attesting Officer*    *Commissioner of Patents and Trademarks*